(12) United States Patent
Lee et al.

(10) Patent No.: US 10,283,624 B1
(45) Date of Patent: May 7, 2019

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Kai-Hsuan Lee, Hsinchu (TW); Bo-Yu Lai, Taipei (TW); Chi-On Chui, Hsinchu (TW); Cheng-Yu Yang, Xihu Township, Changhua County (TW); Yen-Ting Chen, Taichung (TW); Sai-Hooi Yeong, Zhubei (TW); Feng-Cheng Yang, Zhudong Township, Hsinchu County (TW); Yen-Ming Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/875,485

(22) Filed: Jan. 19, 2018

Related U.S. Application Data

(60) Provisional application No. 62/585,720, filed on Nov. 14, 2017.

(51) Int. Cl.
| | |
|---|---|
| *H01L 21/00* | (2006.01) |
| *H01L 29/66* | (2006.01) |
| *H01L 29/78* | (2006.01) |
| *H01L 29/08* | (2006.01) |
| *H01L 21/762* | (2006.01) |
| *H01L 21/306* | (2006.01) |
| *H01L 29/417* | (2006.01) |

(52) U.S. Cl.
CPC .. *H01L 29/66795* (2013.01); *H01L 21/30625* (2013.01); *H01L 21/76224* (2013.01); *H01L 29/0847* (2013.01); *H01L 29/41791* (2013.01); *H01L 29/66545* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |

(Continued)

*Primary Examiner* — Reema Patel
(74) *Attorney, Agent, or Firm* — Birch, Stewart, Kolasch & Birch, LLP

(57) ABSTRACT

A semiconductor device and a method for forming the same are provided. The method includes forming a gate structure over a fin structure. The method further includes forming first gate spacers on opposite sidewalls of the gate structure. The method further includes forming source/drain features in the fin structure and adjacent to the first gate spacers. The method further includes performing a surface treatment process on top surfaces of the source/drain features and outer sidewalls of the first gate spacers. The method further includes depositing a contact etch stop layer (CESL) over the source/drain features and the first gate spacers. A first portion of the CESL is deposited over the top surfaces of the source/drain features at a first deposition rate. A second portion of the CESL is deposited over the outer sidewalls of the first gate spacers at a second deposition rate.

20 Claims, 15 Drawing Sheets

(56) References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2006/0189053 A1* | 8/2006 | Wang | H01L 29/165 438/197 |
| 2012/0276740 A1* | 11/2012 | Zheng | H01L 21/0206 438/682 |
| 2015/0147861 A1* | 5/2015 | Park | H01L 29/66795 438/283 |
| 2016/0141417 A1* | 5/2016 | Park | H01L 29/66545 257/365 |
| 2017/0317213 A1* | 11/2017 | Park | H01L 21/0214 |

\* cited by examiner

SEMICONDUCTOR STRUCTURE AND METHOD FOR FORMING THE SAME

CROSS REFERENCE TO RELATED APPLICATIONS

This application claims the benefit of U.S. Provisional Application No. 62/585,720, filed on Nov. 14, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
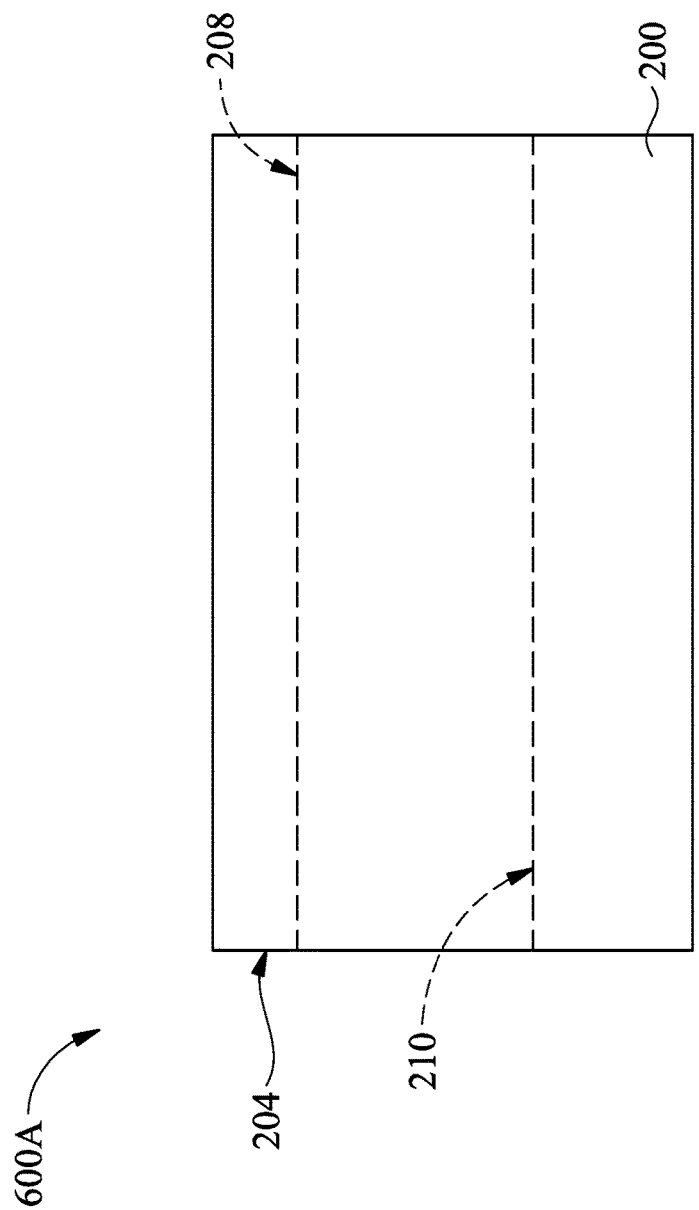
FIGS. 1A-1I are cross-sectional views of various stages of a process for forming a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2:
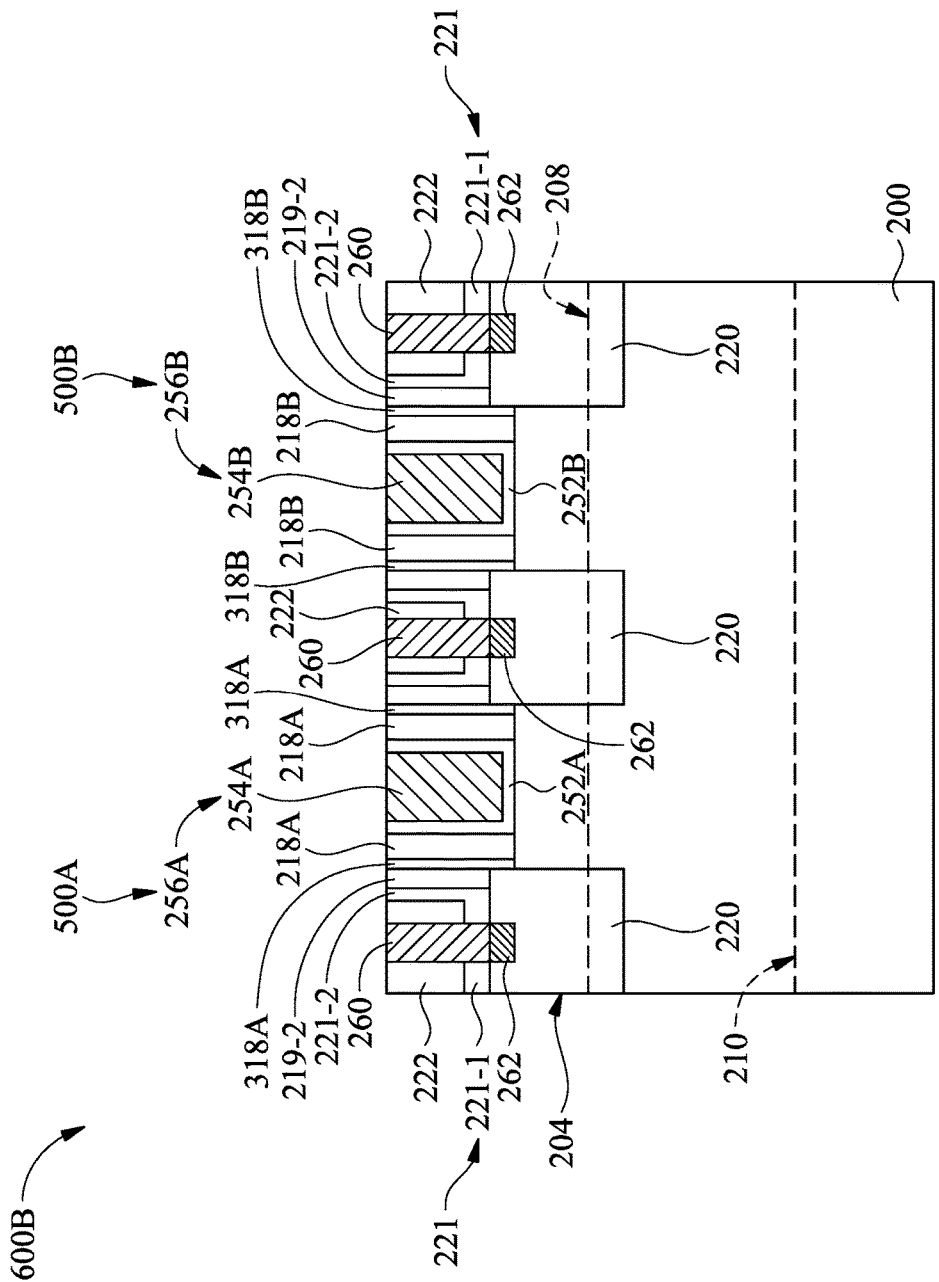
FIG. 2 is a cross-sectional view a semiconductor structure, in accordance with some embodiments.
Figure 3A:
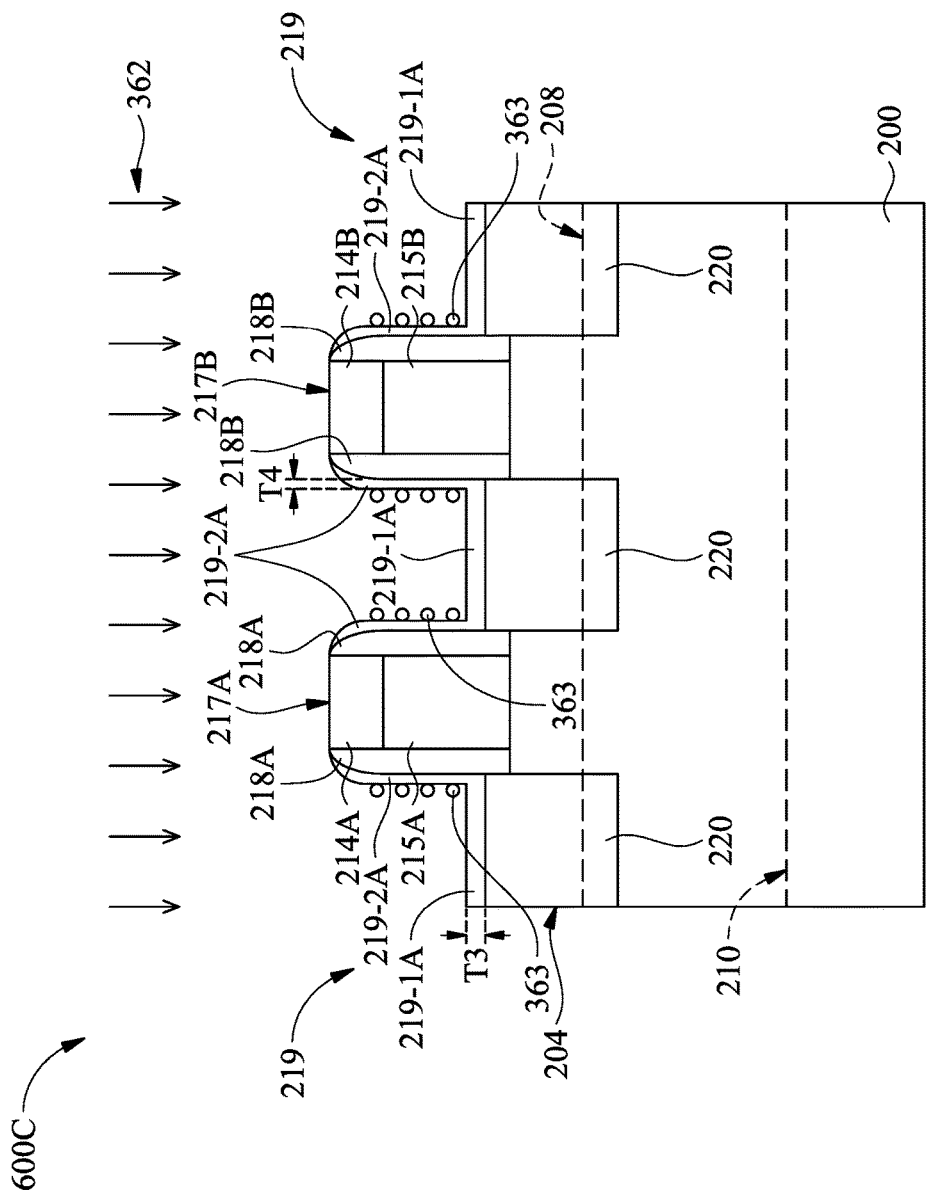
FIGS. 3A-3D are cross-sectional views of various stages of a process for forming a semiconductor structure, in accordance with some embodiments.

Embodiments of a semiconductor structure and a method for forming the same are provided. FIGS. 1A-1I are cross-sectional views of various stages of a process for forming a semiconductor structure 600A, in accordance with some embodiments. FIG. 2 is a cross-sectional view a semiconductor structure 600B, in accordance with some embodiments. FIGS. 3A-3D are cross-sectional views of various stages of a process for forming the semiconductor structure 600C after performing the stage shown in FIG. 1D, in accordance with some embodiments. FIG. 4 is a cross-sectional view a semiconductor structure 600D, in accordance with some embodiments. It should be noted that the cross-sectional views of the semiconductor structure are taken along the longitudinal direction (the channel length direction of a FinFET) of a fin structure (e.g. a fin structure 204) of the semiconductor structure.

In some embodiments, a gate-replacement process is employed to fabricate the semiconductor structures 600A, 600B, 600C and 600D, such as a fin field effect transistor (FinFET) (e.g. FinFETs 500A and 500B).

As shown in FIG. 1A, a substrate 200 including a fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the fin structure 204 is formed by performing a patterning process on the substrate 200. The fin structure 204 may be surrounded by trenches (not shown) formed in the substrate 200 by the patterning process. The isolation regions (not shown) (e.g. shallow trench isolation (STI) structures) may be formed on a bottom surface 210 of the trenches. A lower portion of the fin structure 204 is surrounded by the isolation structures, and an upper portion of the fin structure 204 protrudes from a top surface 208 of each of the isolation structures.

Figure 1B:
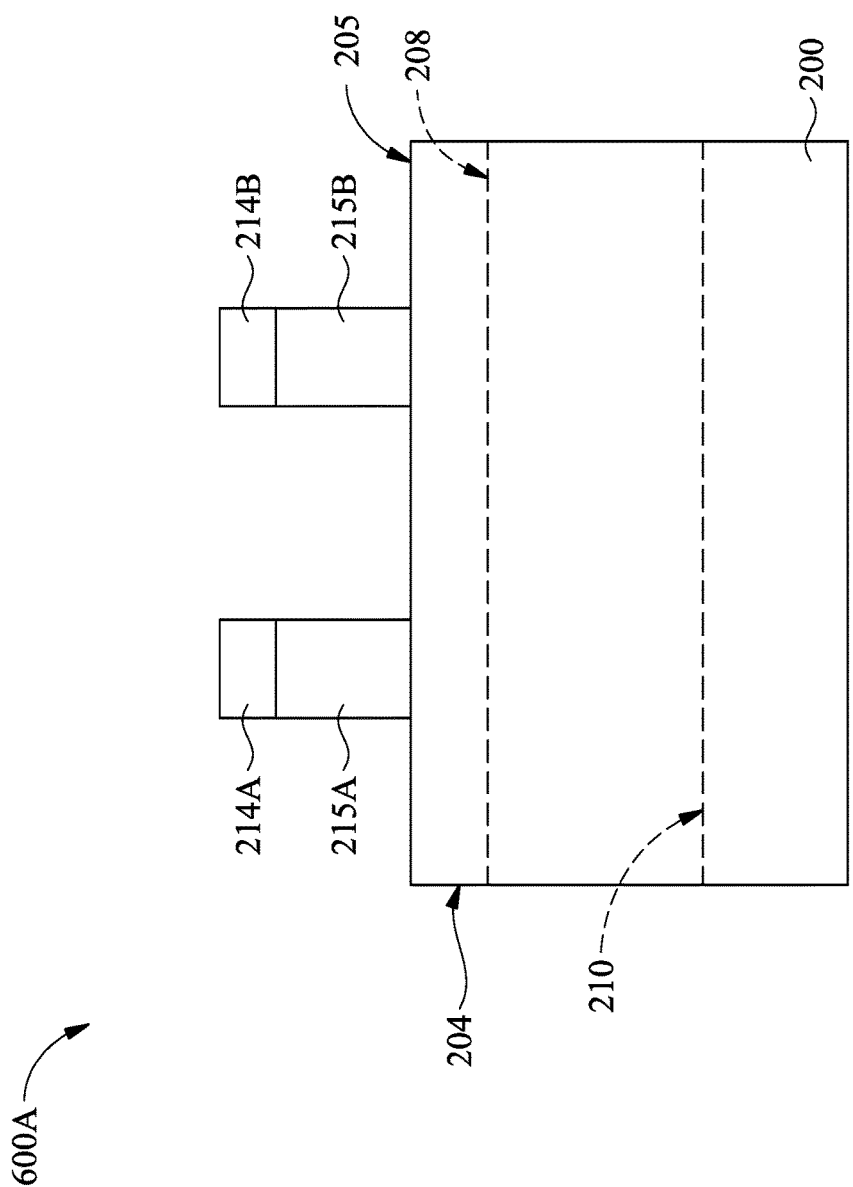

After the isolation regions are formed, a dummy gate structure 215A and a dummy gate structure 215B are formed over a top surface 205 of the fin structure 204, as shown in FIG. 1B in accordance with some embodiments. A hard mask layer 214A is formed over the dummy gate structure 215A, and a hard mask layer 214B is formed on the dummy gate structure 215B. In addition, the dummy gate structures 215A and 215B are formed over the isolation structures.

In some embodiments, the dummy gate structures 215A and 215B cover respective channel regions of the resulting finFETs (e.g. FinFETs 500A and 500B) on the fin structure 204. The dummy gate structures 215A and 215B may extend along a direction that is perpendicular to a longitudinal direction 300 of the fin structure 204 and arrange along the longitudinal direction 300 of the fin structure 204. In some embodiments, the dummy gate structures 215A and 215B cover the top surface 205 and sidewalls of the fin structure 204, and extend over the isolation region and the substrate 200 outside the fin structure 204.

In some embodiments, each of the dummy gate structures 215A and 215B includes a gate dielectric (not shown) and a gate electrode (not shown) formed over the gate dielectric. In some embodiments, the gate dielectric is silicon dioxide. In some embodiments, the silicon dioxide is a thermally grown oxide. In some embodiments, the gate dielectric is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode includes polycrystalline-silicon (poly-Si), poly-crystalline silicon-germanium (poly-SiGe), metallic nitride, metallic silicide, metallic oxide, metal, and other suitable layers. In some embodiments, the gate electrode is made of, for example, polysilicon.

In some embodiments, each of the hard mask layers 214A and 214B includes a single layer structure or a multi-layer structure. In some embodiments, the hard mask layers 214A and 214B are made of silicon oxide, silicon nitride, silicon oxynitride, silicon carbide, another suitable material, or a combination thereof.

In some embodiments, the formation of the dummy gate structures 215A and 215B and the hard mask layers 214A and 214B includes a deposition process and a subsequent patterning process. The deposition process is performed to deposit a gate dielectric material layer (not shown), a gate electrode material layer (not shown) and a hard mask material (not shown) in sequence. The patterning process is then performed to partially remove the gate dielectric material layer, the gate electrode material layer and a hard mask material. Therefore, the dummy gate structure 215A and the overlying hard mask layer 214A, and the dummy gate structure 215C and the overlying hard mask layer 214C are formed over the fin structure 204. In some embodiments, the deposition process includes a chemical vapor deposition (CVD) process, a physical vapor deposition (PVD) process, an atomic layer deposition (ALD) process, a thermal oxidation process, or another applicable process. In some embodiments, the patterning process includes a photolithography process and a subsequent etching process. In some embodiments, the etching process is a dry etching process.

Figure 1C:
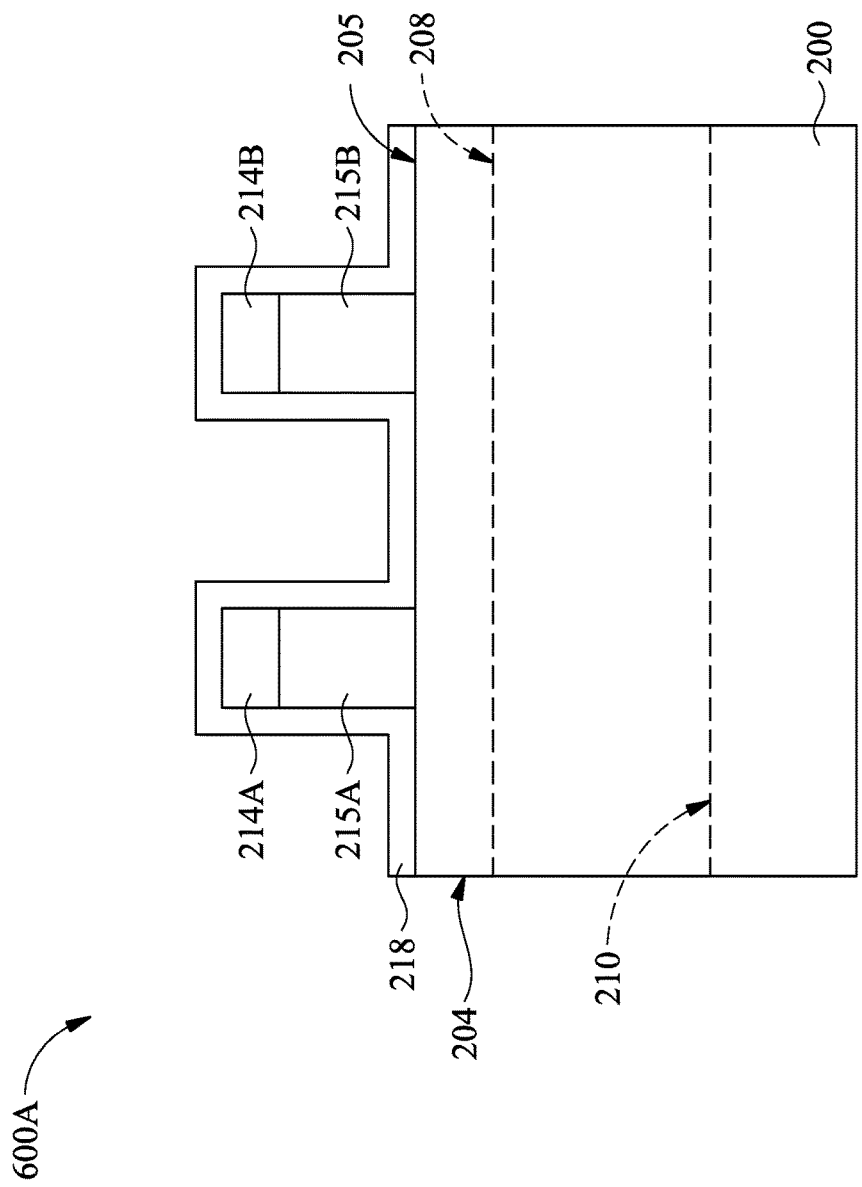

After the dummy gate structures 215A and 215B and the hard mask layers 214A and 214B are formed, a gate spacer layer 218 is entirely formed over the fin structure 204, the dummy gate structures 215A and 215B and the hard mask layers 214A and 214B, as shown in FIG. 1C in accordance with some embodiments. In addition, the gate spacer layer 218 is conformally formed over the dummy gate structures 215A and 215B. In some embodiments, the gate spacer layer 218 includes a single layer structure or a multi-layer structure. The gate spacer layer 218 may be made of low dielectric constant (low-k) materials (e.g. k<5), such as silicon oxide, silicon nitride, silicon oxynitride, silicon carbide, silicon carbonitride, another suitable material, or a combination thereof. The gate spacer layer 218 may be deposited using a chemical vapor deposition (CVD) process, a physical vapor deposition (PVD) process, a spin-on process, another applicable process, or a combination thereof.

Figure 1D:
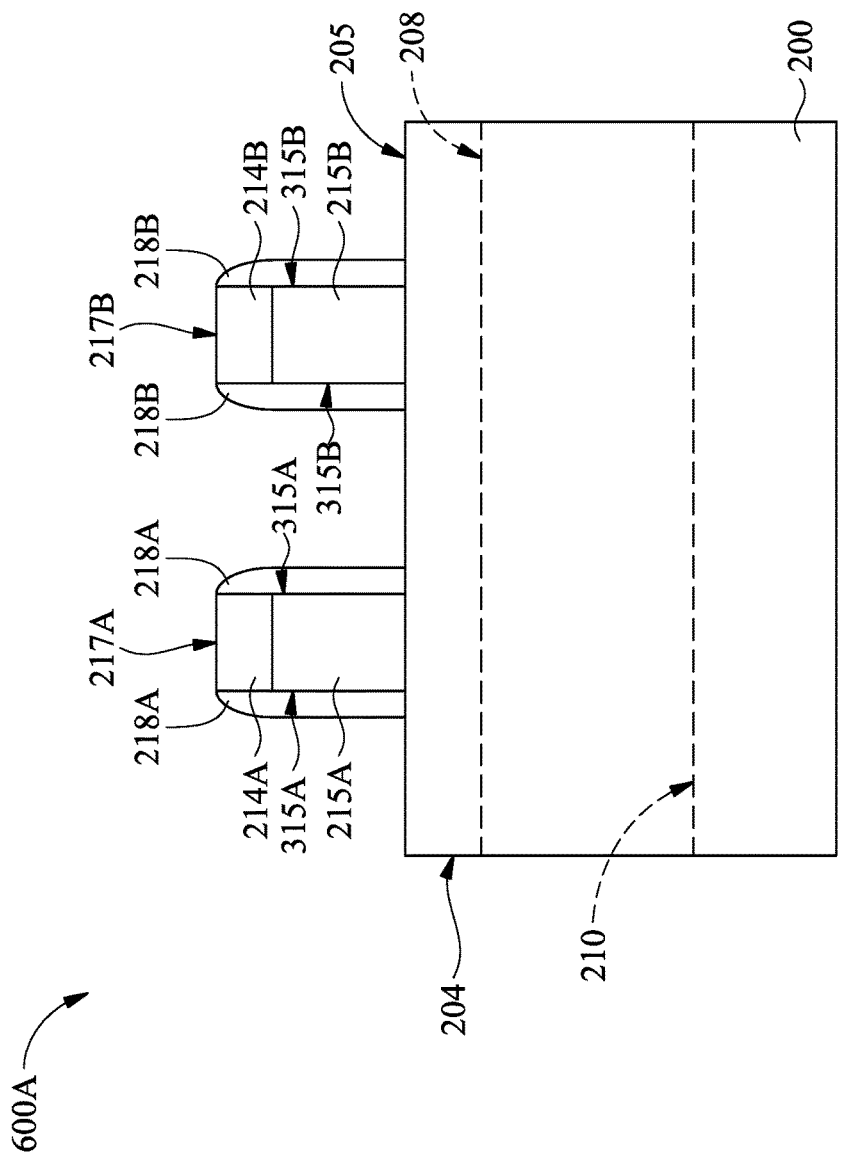

Afterwards, gate spacers 218A and 218B are formed on opposite sidewalls 315A and 315B of the dummy gate structure 215A and 215B and over the fin structure 204, as shown in FIG. 1D in accordance with some embodiments. In some embodiments, the gate spacers 218A and 218B are formed by an etching process. The etching process is performed to remove the gate spacer layer 218 until the top surface 205 of the fin structure 204 is exposed. The material of the gate spacers 218A and 218B may be made of low dielectric constant (low-k) materials (e.g. k<5), such as silicon oxide, silicon nitride, silicon oxynitride, silicon carbide, silicon carbonitride, another suitable material, or a combination thereof. In some embodiments, the etching process includes a dry etch process.

Figure 1E:
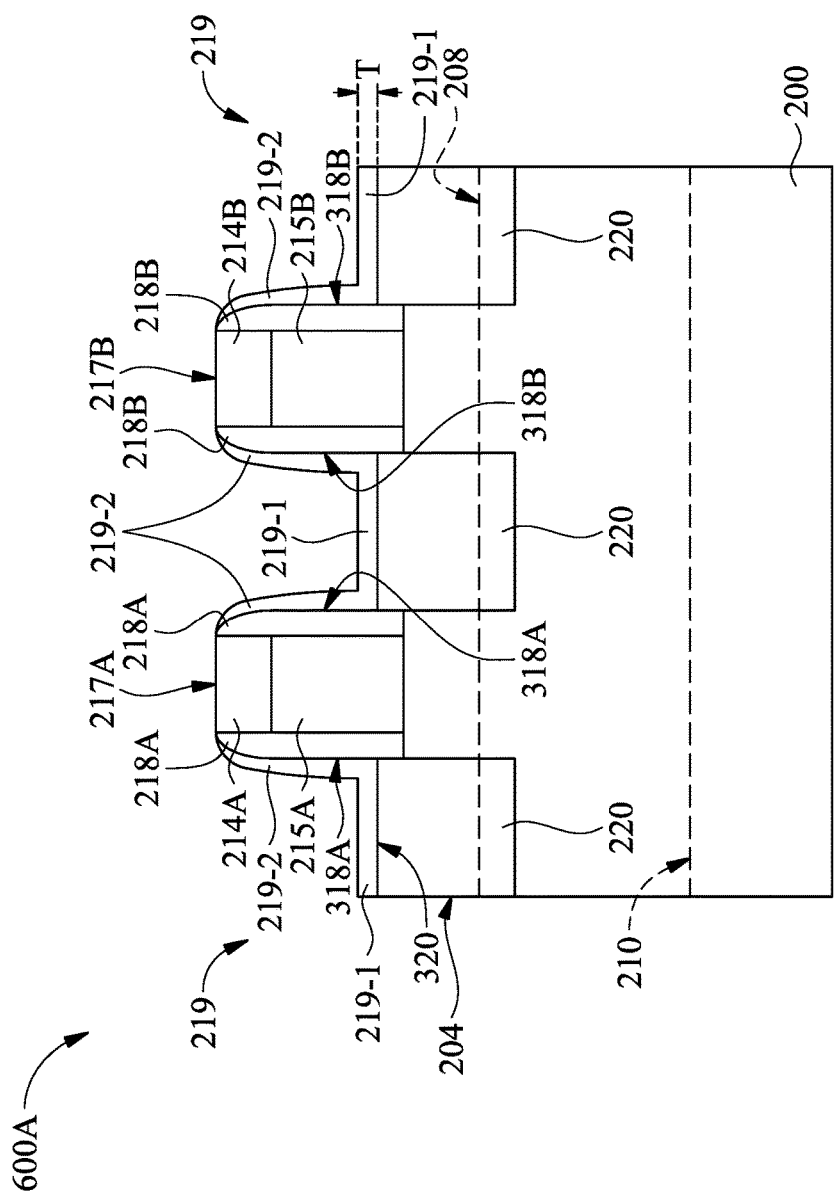

After the gate spacers 218A and 218B are formed, source/drain features 220 are formed in portions of the fin structure 204 that is not covered by the dummy gate structure 215A, the dummy gate structure 215B, the gate spacers 218A and the gate spacers 218B, as shown in FIG. 1E in accordance with some embodiments. The source/drain features 220 may be formed in the fin structure 204 and adjacent to outer sidewalls 318A of the gate spacers 218A and outer sidewalls 318B of the gate spacers 218B. In some embodiments, the source/drain features 220 are formed close to the dummy gate structure 215A and 215B. The source/drain features 220 are respectively formed on the opposite sidewalls of the dummy gate structure 215A and 215B.

In some embodiments, the source/drain features 220 may include a strain material to apply stress to the channel region. For example, the source/drain features 220 are formed of Ge, SiGe, InAs, InGaAs, InSb, GaAs, GaSb, InAlP, InP, or the like. In some embodiments, the lattice constant of the source/drain features 220 are different from the lattice constant of the fin structure 204. In some embodiments, the source/drain features 220 have a diamond shape.

The source/drain features 220 may be formed by an etching process and a subsequent filling process. The etching process is performed to form recesses (not shown) adjacent the gate spacers 218A and 218B and in the fin structure 204. In some embodiments, the etching process is a dry etching process. In some embodiments, the filling process (not shown) is performed by filling the recesses with one or more strained semiconductor materials to form the source/drain features 220. In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process.

After the source/drain features 220 are formed, a native oxide 219 may be formed over the source/drain features 220, the gate spacers 218A and the gate spacers 218B, as shown in FIG. 1E in accordance with some embodiments. The native oxide 219 is formed due to the exposure of the source/drain features 220, the gate spacers 218A and the gate spacers 218B to open air. In some embodiments, the native oxide 219 includes a first native oxide portion 219-1 and a second native oxide portion 219-2 connecting to the first native oxide portion 219-1. The first native oxide portion 219-1 may be formed directly on top surfaces 320 of the source/drain features 220. The second native oxide portion 219-2 may be formed directly on outer sidewalls 318A of the gate spacers 218A and outer sidewalls 318B of the gate spacers 218B. In some other embodiments, the native oxide (not shown) may be formed over a top surface 217A of the hard mask layers 214A and a top surface 217B of the hard mask layer 214B.

Figure 1F:
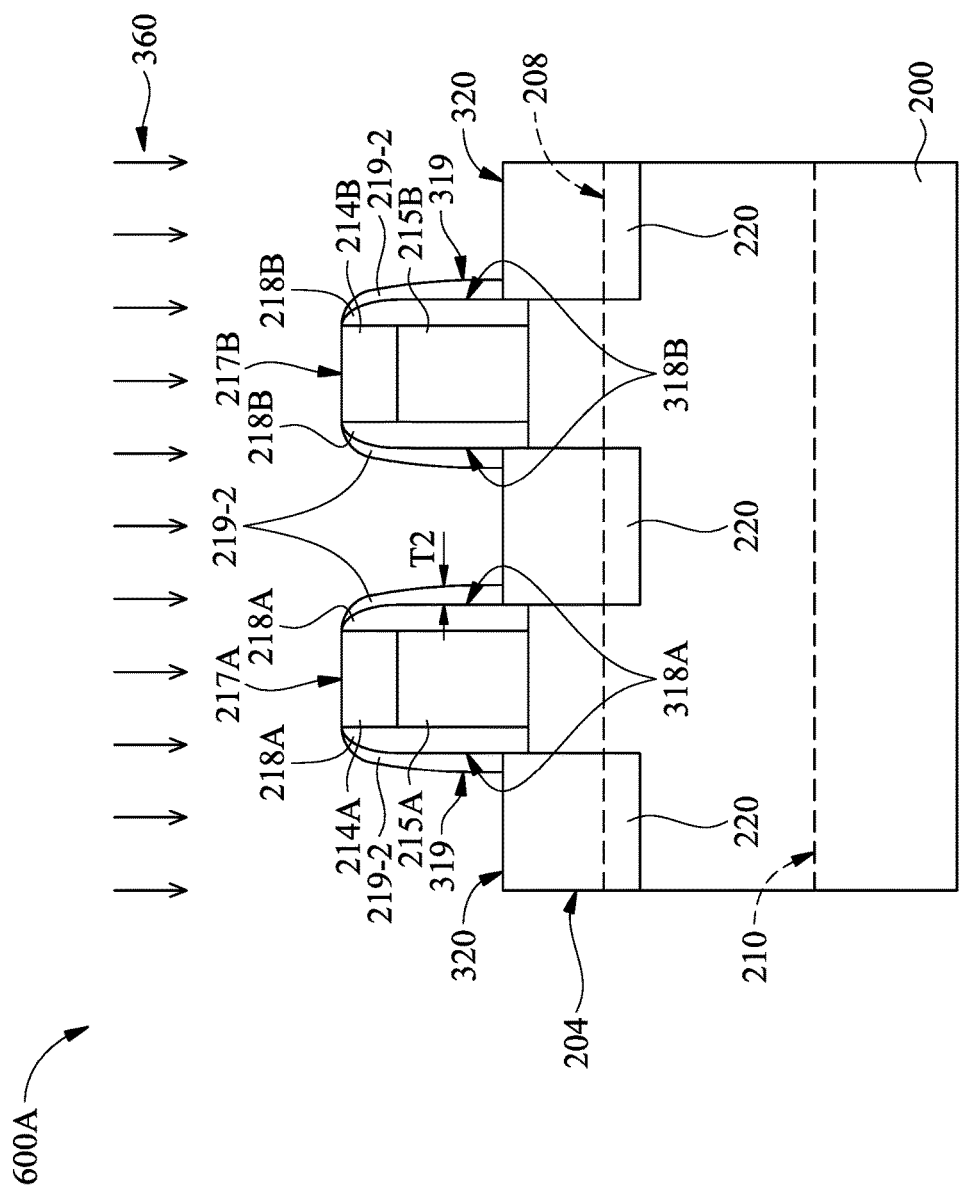

Afterwards, a surface treatment process 360 is performed on the top surfaces 320 of the source/drain features 220, the outer sidewalls 318A of the gate spacers 218A and the outer sidewalls 318B of the gate spacers 218B, as shown in FIG. 1F in accordance with some embodiments. In some embodiments, the surface treatment process 360 includes a plasma pre-cleaning process to clean (remove) the native oxide 219. The surface treatment process 360 (i.e. the plasma pre-cleaning process) may be an anisotropic cleaning (removal) process, so that the native oxide 219 is partially removed after performing the surface treatment process 360. More specifically, the surface treatment process 360 is performed on the first native oxide portion 219-1 without affecting the second native oxide portion 219-2. In some embodiments, the surface treatment process 360 is performed until the top surfaces 320 of the source/drain features 220 are exposed. After the surface treatment process 360 is performed, the first native oxide portion 219-1 on top surfaces 320 of the source/drain features 220 may be removed while the second native oxide portion 219-2 on outer sidewalls 318A of the gate spacers 218A and outer sidewalls 318B of the gate spacers 218B may be left. Therefore, the thickness of the first native oxide portion 219-1 may be close to zero, and the second native oxide portion 219-2 of the native oxide 219 has a thickness T2 after performing the surface treatment process 360. The thickness T2 of the second native oxide portion 219-2 may serve as a distance between an outer sidewall 319 of the second native oxide portion 219-2 and the outer sidewall 318A/318B of the gate spacer 218A/218B covered by the corresponding second native oxide portion 219-2. In addition, the thickness of the first native oxide portion 219-1 is less than the thickness T2 of the second native oxide portion 219-2. It should be noted that the thickness T2 of the second native oxide portion 219-2 of the native oxide 219 (shown in FIG. 1F) after performing the surface treatment process 360 may be equal to (or less than) the thickness T of the native oxide 219 (shown in FIG. 1E) before performing the surface treatment process 360.

In some other embodiments, the surface treatment process 360 is performed to partially remove the first native oxide portion 219-1. The thickness of the first native oxide portion 219-1 is less than the thickness T2 of the second native oxide portion 219-2 after performing the surface treatment process 360.

In some embodiments, the plasma pre-cleaning process, which is used as the surface treatment process 360, is performed using a process gas including argon (Ar), nitrogen ($N_2$), $H_2$/He, $H_2$, $NH_3$ or a combination thereof. The plasma pre-cleaning process is performed using the process gas in a flow rate in a range from about 10 sccm to about 1000 sccm in an radio-frequency/direct-current (RF/DC) plasma. The plasma pre-cleaning process may be performed using a precursor including $C_4F_8$ or $CF_4$. The plasma pre-cleaning process is performed with a bombardment energy in a range from about 10 eV to about 1000 eV. The plasma pre-cleaning process is performed at a pressure in a range from about 100 Pa to about 1000 Pa and for a period of time in a range from about 30 seconds to about 300 seconds.

Figure 1G:
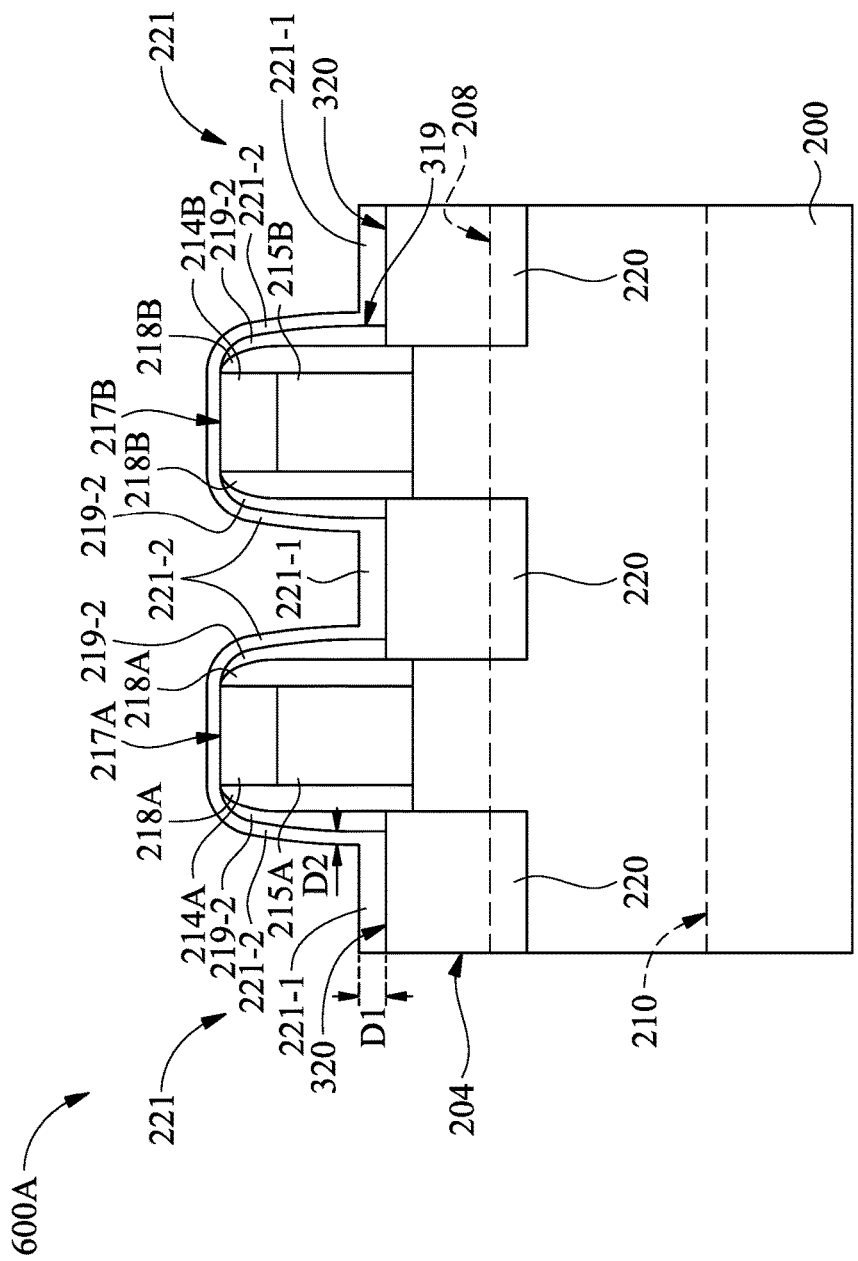

After the surface treatment process 360 is performed, a contact etch stop layer (CESL) 221 is conformally deposited over the source/drain features 220 and the gate spacers 218A and 218B by a thin film deposition process, as shown in FIG. 1G in accordance with some embodiments. The CESL 221 may serve as an etch stop layer of the subsequent etching process configured to form source/drain contact holes (not shown). In some embodiments, the CESL 221 includes a first portion 221-1 and a second portion 221-2 connecting to the first portion 221-1. The first portion 221-1 of the CESL 221 may be formed covering the top surfaces 320 of the source/drain features 220. In addition, the second portion 221-2 of the CESL 221 may be formed covering the outer sidewalls 319 of the second native oxide portion 219-2 of the native oxide 219. The first portion 221-1 of the CESL 221 may be deposited over the top surfaces 320 of the source/drain features 220 at a first deposition rate, and the second portion 221-2 of the CESL 221 may be deposited over the outer sidewalls 318A and 318B of the gate spacers 218A and 218B at a second deposition rate. It should be noted that some ions with positive charges may be left on the top surfaces 320 of the source/drain features 220 during the surface treatment process 360, the charged ions may help to increase the deposition rate of the CESL 221. Therefore, the first deposition rate may be higher than the second deposition rate.

The thickness D1 of the first portion 221-1 and the thickness D2 of the second portion 221-2 of the deposited CESL 221 may be in a range from about 1 nm to about 10 nm. In some embodiments, the thickness D1 of the first portion 221-1 of the deposited CESL 221 is different from the thickness D2 of the second portion 221-2 of the deposited CESL 221 after performing the surface treatment process 360. For example, the thickness D1 of the first portion 221-1 of the CESL 221 is greater than the thickness D2 of the second portion 221-2 of the CESL 221 after performing the plasma pre-cleaning process. The difference between the thickness D1 of the first portion 221-1 and the thickness D2 of the second portion 221-2 of the CESL 221 is greater than or equal to 2 nm. For example, the thickness D1 of the first portion 221-1 of the CESL 221 is about 5 nm, and the thickness D2 of the second portion 221-2 of the CESL 221 is about 3 nm.

In some embodiments, the CESL 221 may be a single layer or multiple layers. The CESL 221 may be made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the CESL 221 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer. In some embodiments, the CESL 221 is formed by performing a plasma enhanced chemical vapor deposition (CVD) process, a low pressure CVD process, an atomic layer deposition (ALD) process, or another applicable process.

Figure 1H:
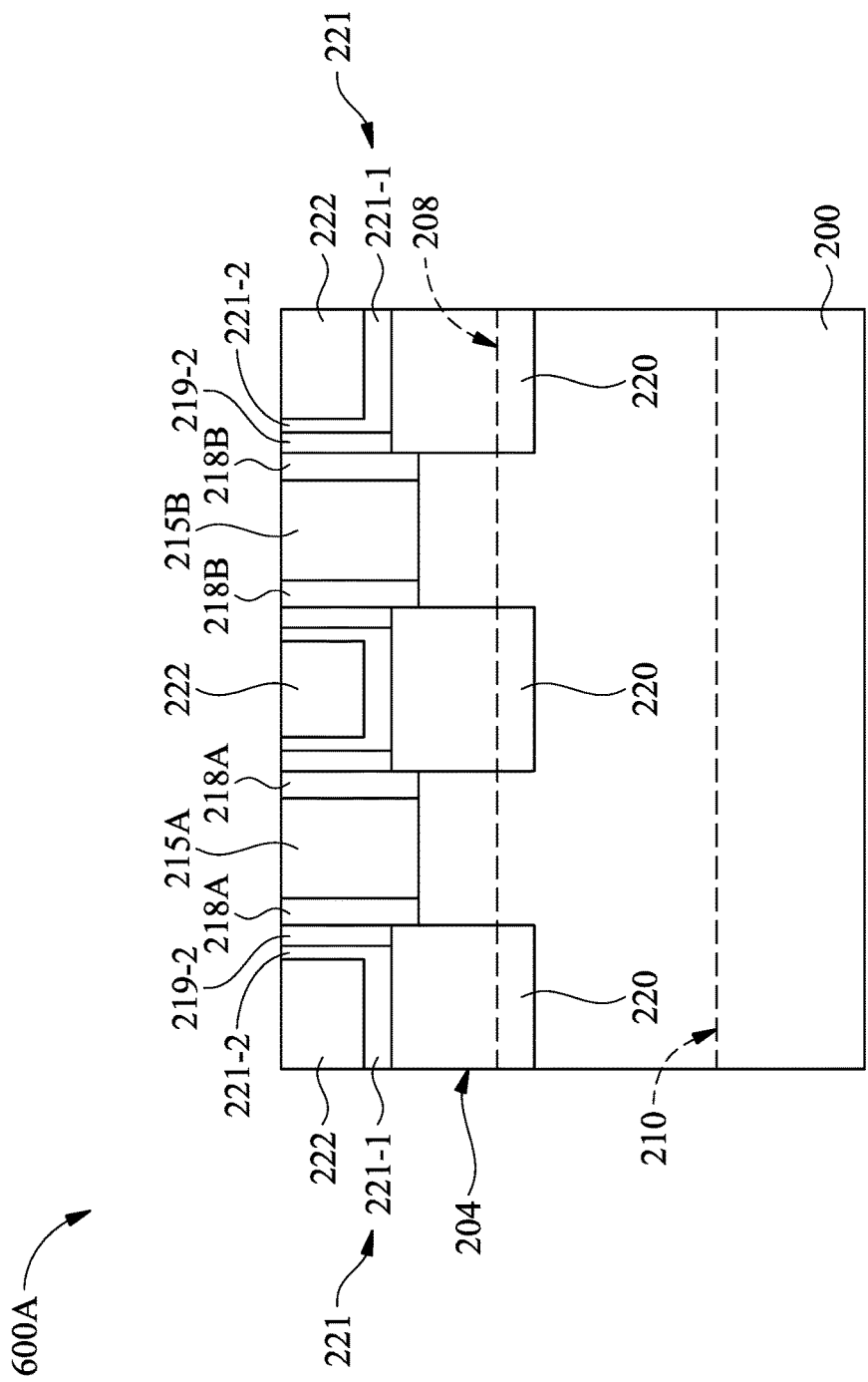

After the CESL 221 is formed, an inter-layer dielectric (ILD) layer 222 is formed over the fin structure 204, the dummy gate structures 215A and 215B, the gate spacers 218A and 218B, and the source/drain features 220, as shown in FIG. 1H in accordance with some embodiments. The ILD layer 222 may be formed over the CESL 221 and may fill gaps between the dummy gate structures 215A and 215B. In some embodiments, the dummy gate structures 215A and 215B are surrounded by the ILD layer 222.

In some embodiments, a deposition process is performed to form the ILD layer 222 over the CESL 221. Afterwards, a planarization process is performed to level the top surfaces of CESL 221, the ILD layer 222, the gate spacers 218A and 218B, and the dummy gate structures 215A and 215B, as shown in FIG. 1H.

In some embodiments, the ILD layer 222 is made of silicon oxide, un-doped silicate glass (USG), fluorinated silicate glass (FSG), carbon-doped silicate glass, silicon nitride or silicon oxynitride. In some embodiments, the ILD layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the deposition process of the ILD layer 222 includes a plasma enhanced chemical vapor deposition (CVD) process, a low pressure CVD process, an atomic layer deposition (ALD) process, a spin-on coating process, or another applicable process. In some embodiments, the planarization process includes a chemical mechanical polishing (CMP) process, a grinding process, an etching process, another applicable process, or a combination thereof.

Figure 1I:
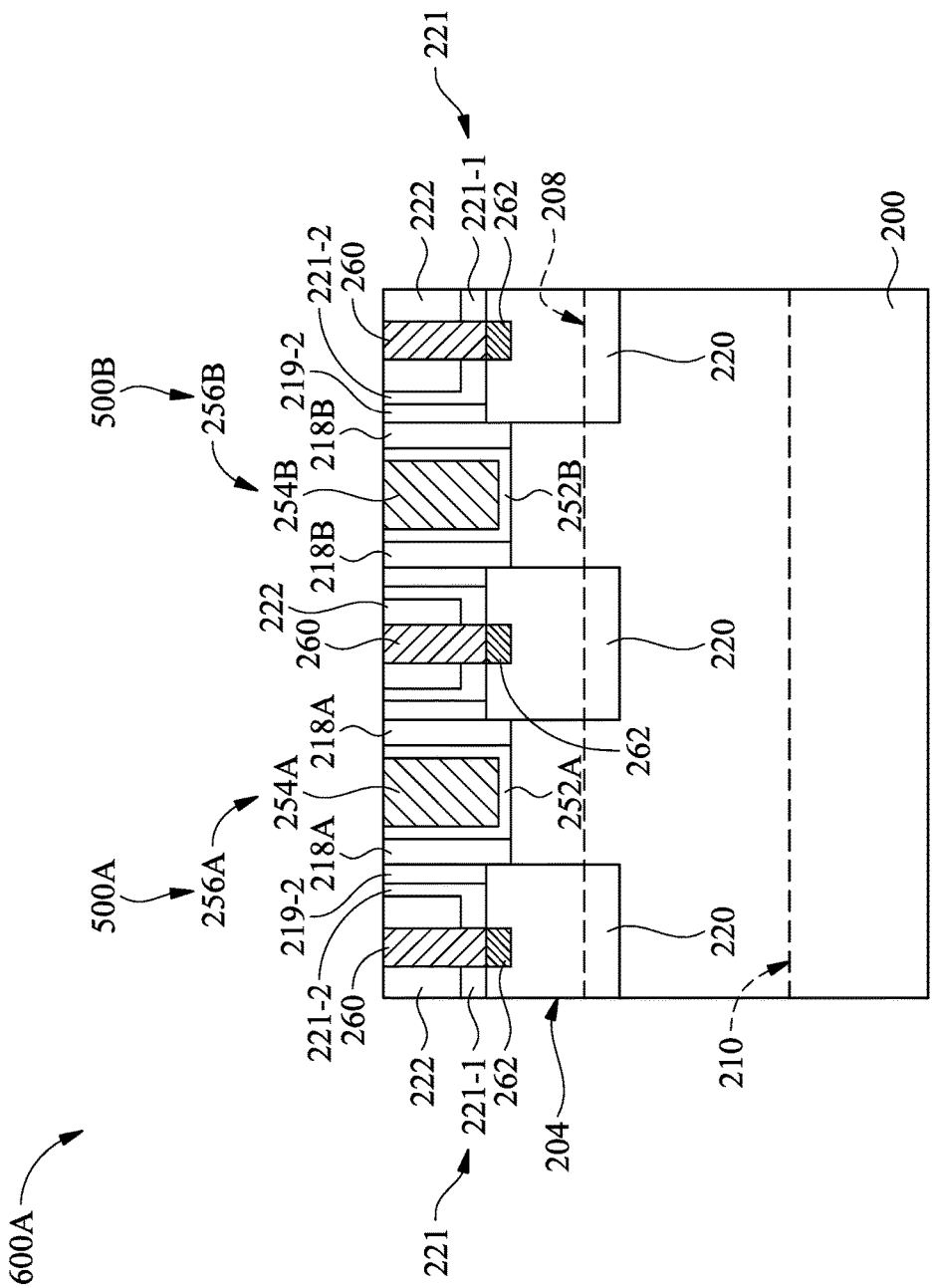

After the ILD layer 222 is formed, metal gate structures 256A and 256B are formed to replace the dummy gate structure 215A and 215B by a removal process and subsequent deposition processes, and as shown in FIG. 1I in accordance with some embodiments. In some embodiments, the metal gate structure 256A surrounded by the gate spacers 218A includes a gate dielectric layer 252A and a gate electrode layer 254A over the gate dielectric layer 252A. Similarly, the metal gate structure 256B surrounded by the gate spacers 218B may include a gate dielectric layer 252B and a gate electrode layer 254B over the gate dielectric layer 252B.

In some embodiments, the gate dielectric layers 252A and 252B include a single layer or multiple layers. In some embodiments, the gate dielectric layers 252A and 252B have a U-shape or a rectangular shape. In some embodiments, the gate dielectric layers 252A and 252B are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252A and 252B may include MBD, ALD, PECVD, and the like.

In some embodiments, the gate electrode layers 254A and 254C are made of a metal-containing material such as TiN, TaN, TaC, Co, Ru, Al, combinations thereof, or multi-layers thereof, and are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, a work function layer (not shown) may be formed in the metal gate structures 256A and 256B. The work function layer may include N-work-function metal or P-work-function metal. The P-type work function layer may include TiN, TaN, Ru, Mo, Al, WN, $ZrSi_2$, $MoSi_2$, $TaSi_2$, $NiSi_2$, WN, other suitable P-type work function materials, or a combination thereof. The N-type work function layer may include Ti, Ag, TaAl, TaAlC, TiAlN, TaC, TaCN, TaSiN, Mn, Zr, other suitable N-type work function materials, or a combination thereof.

After the metal gate structures 256A and 256B are formed, source/drain silicide layers 262 and contact plugs 260 above the source/drain silicide layers 262 are formed over the source/drain features 220, as shown in FIG. 1I in accordance with some embodiments. The source/drain silicide layers 262 may be formed by an etching process, a deposition process and a thermal anneal process. In some embodiments, the etching process is performed to form openings (not shown) that expose the source/drain features 220. The deposition process is performed to form a metal capable of reacting with semiconductor materials (e.g. silicon, germanium) to form silicide or germanide regions in the openings. The thermal anneal process is performed so that the deposited metal reacts with the source/drain features 220 to form the silicide regions 262. After the thermal anneal process, the unreacted metal is removed.

Afterward, the contact plugs 260 are formed filling the openings (not shown) that expose the source/drain features 220 by deposition processes and a subsequent planarization process such as CMP. In some embodiments, the contact plugs 260 are made of a conductive material, such as copper (Cu), aluminum (Al), tungsten (W), titanium (Ti), titanium nitride (TiN), tantalum (Ta), tantalum nitride (TaN), or another applicable material, and are formed by any suitable deposition method, such as PVD, CVD, ALD, plating (e.g., electroplating).

After performing the aforementioned processes, a FinFET 500A and a FinFET 500B are formed over the fin structure 204. Moreover, a semiconductor structure 600A including the FinFET 500A and the FinFET 500B is formed, as shown in FIG. 1I in accordance with some embodiments.

In some embodiments, the method for forming the semiconductor structure 600A uses a plasma pre-cleaning process as the surface treatment process 360 to remove the native oxide (the first native oxide portion 219-1) on the top surfaces 320 of the source/drain features 220 before forming the CESL 221. After the plasma pre-cleaning process is performed, the positive charged ions are left on the top surfaces 320 of the source/drain features 220. Therefore, the first portion 221-1 of the CESL 221 on the source/drain features 220 is deposited at a higher deposition rate than that of the second portion 221-2 of the CESL 221 on the outer sidewalls 318A and 318B of the gate spacers 218A and 218B. The thickness of the CESL 221 on the gate spacers 218A and 218B (i.e. the thickness D2 of the second portion 221-2) can be reduced while the thickness of the CESL 221 on the source/drain features 220 (i.e. the thickness D1 of the first portion 221-1) can be kept. The reduced thickness of the CESL 221 on the outer sidewalls 319 of the gate spacers 218A and 218B may help to reduce the parasitic capacitance between the contact plugs 260 and the metal gate structures of the adjacent FinFET 500A and 500B. The thickness of the CESL 221 on the source/drain features 220 may be maintained in an enough value to protect the source/drain features 220 during the contact hole etching process.

FIG. 2 is a cross-sectional view a semiconductor structure 600B, in accordance with some embodiments. The materials, configurations, structures and/or processes of the semiconductor structure 600B may be similar to, or the same as, those of the semiconductor structure 600A, and the details thereof are not repeated herein. One of the differences between the semiconductor device structure 600A and the semiconductor device structure 600B is that the semiconductor device structure 600B includes gate spacers 318A and 318B formed over the fin structure 204 and the gate spacers 218A and 218B before forming source/drain features 220. The surface treatment process 360 may help to reduce the thickness of the CESL 221 on the outer sidewalls 319 of the gate spacers 218A and 218B. Therefore, the space between the metal gate structures 256A of the FinFET 500A and the metal gate structures 256B of the FinFET 500B can be enlarged for the formation of the additional gate spacers 318A and 318B. The gate spacers 318A and 318B and the gate spacers 218A and 218B may be formed of low-k dielectric materials (k<5) and collectively formed composited gate spacer structures. The gate spacers 318A and 318B may help to increase the total thickness of the low-k composited gate spacer structures. Therefore, the leakage problem between the adjacent FinFETs can be eliminated. In addition, the gate spacers 318A and 318B may improve the alternating current (AC) gain of the ring oscillators applied in the semiconductor structure 600B.

FIGS. 3A-3D are cross-sectional views of various stages of a process for forming the semiconductor structure 600C after performing the stage shown in FIG. 1E, in accordance with some embodiments. The materials, configurations, structures and/or processes of the semiconductor structure 600C may be similar to, or the same as, those of the semiconductor structure 600A, and the details thereof are not repeated herein.

After the source/drain features 220 are formed, the native oxide 219 may be formed on the source/drain features 220, the gate spacers 218A and the gate spacers 218B (FIG. 1E). Afterward, a surface treatment process 362 is performed on the top surfaces 320 of the source/drain features 220, the outer sidewalls 318A of the gate spacers 218A and the outer sidewalls 318B of the gate spacers 218B, as shown in FIG. 3A in accordance with some embodiments. In some embodiments, the surface treatment process 362 includes an isotropic etching process to isotropically clean (remove) the native oxide 219. Therefore, different portions of the native oxide 219 are uniformly removed to form a first native oxide portion 219-1A on the source/drain features 220 and a second native oxide portion 219-2A on the outer sidewalls 318A and 318B of the gate spacers 218A and 218B. After the surface treatment process 362 (i.e. the isotropic etching process) is performed, the thickness T3 of the first native oxide portion 219-1A may be the equal to the thickness T4 of the second native oxide portion 219-2A of the native oxide 219. In some other embodiments, the thickness T3 of the first native oxide portion 219-1A is greater than thickness T4 of the second native oxide portion 219-2A. It should be noted that the thickness T3 of the first native oxide portion 219-1A and the thickness T4 of the second native oxide portion 219-2A of the native oxide 219 (shown in FIG. 3A) after performing the plasma pre-cleaning process 362 may be less than the thickness T of the native oxide 219 (shown in FIG. 1E) before performing the plasma pre-cleaning process 362.

In some embodiments, the surface treatment process 362 is performed using diluted hydrofluoric (DHF) acid. In addition, impurities 363 including carbon and/or fluorine may be left on sidewalls of the second native oxide portion 219-2A after performing the surface treatment process 362.

Figure 3B:
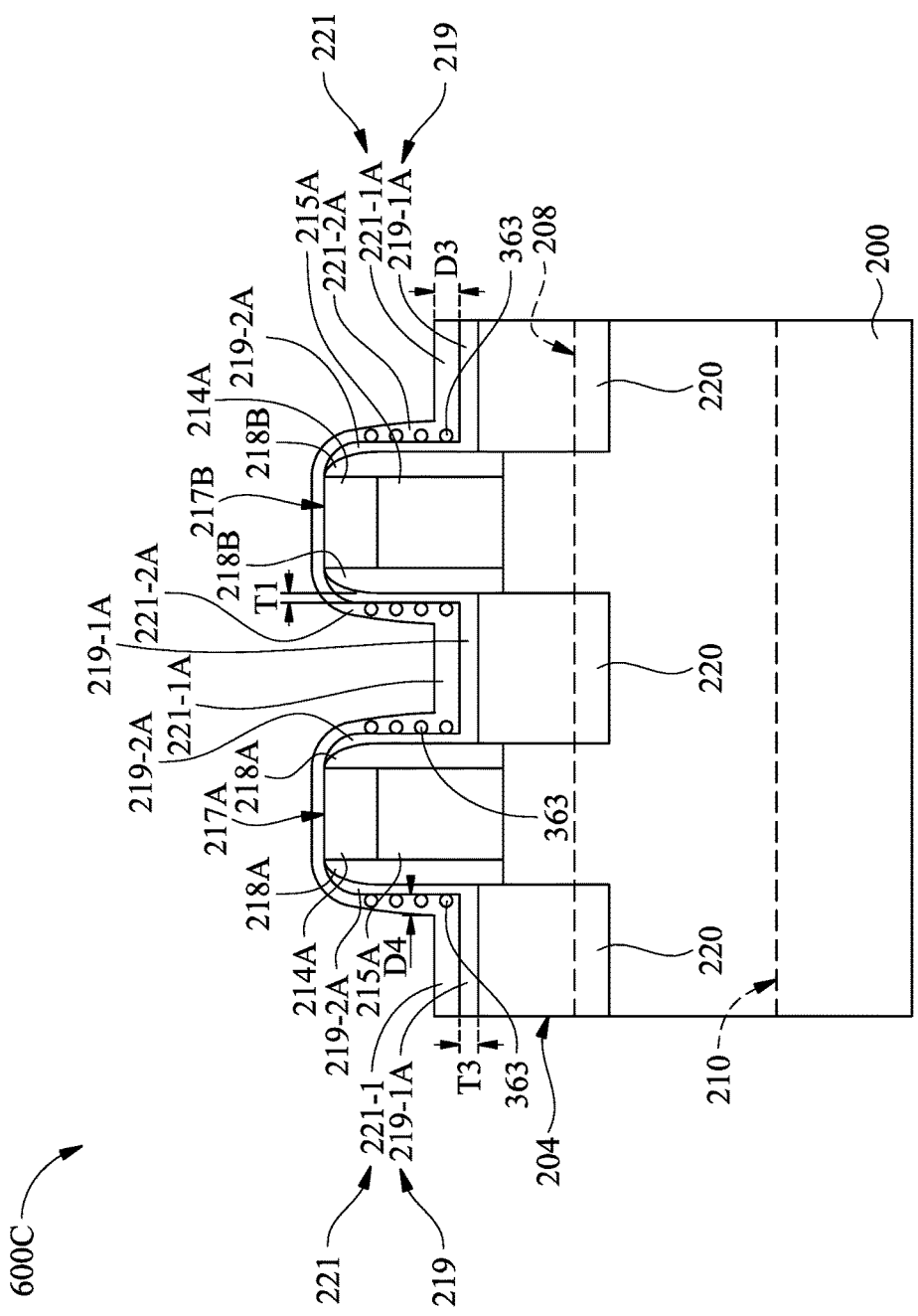
Figure 4:
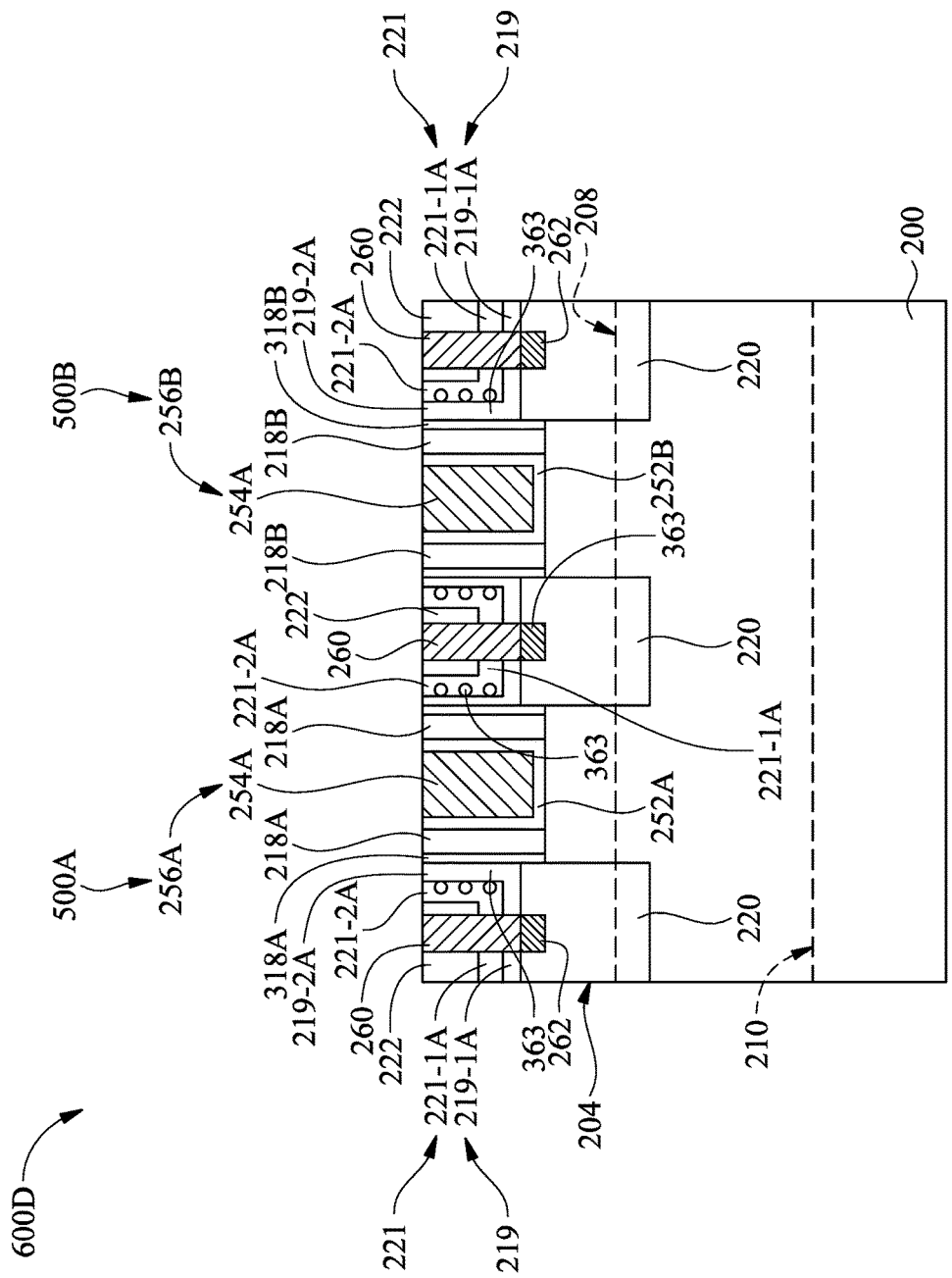
FIG. 4 is a cross-sectional view a semiconductor structure, in accordance with some embodiments.

After the surface treatment process 362 is performed, a contact etch stop layer (CESL) 221 is conformally deposited over the source/drain features 220 and the gate spacers 218A and 218B by a thin film deposition process, as shown in FIG. 3B in accordance with some embodiments. In some embodiments, the CESL 221 includes a first portion 221-1A and a second portion 221-2A connecting to the first portion 221-1A. The first portion 221-1A of the CESL 221 may be deposited over the top surfaces 320 of the source/drain features 220 at a first deposition rate, and the second portion 221-2A of the CESL 221 may be deposited over the outer sidewalls 318A and 318B of the gate spacers 218A and 218B at a second deposition rate. The first deposition rate may be different from the second deposition rate. It should be noted that the impurities 363 (e.g. carbon (C) and/or fluorine (F) atoms) on the outer sidewalls 318A and 318B of the gate spacers 218A and 218B may be chemically bonded to nitride atoms of the gate spacers 218A and 218B. The chemical bondings between the impurities 363 and the gate spacers 218A and 218B may have a negative influence on the nucleation and growth rate kinetics of the deposition process of the CESL 221. Therefore, the second deposition rate may be lower than the first deposition rate.

In some embodiments, the thickness D3 of the first portion 221-1A and the thickness D4 of the second portion 221-2A of the deposited CESL 221 may be in a range from about 1 nm to about 10 nm. The thickness D3 of the first portion 221-1A of the deposited CESL 221 may be different from the thickness D4 of the second portion 221-2A of the deposited CESL 221 after performing the surface treatment process 360. For example, the thickness D3 of the first portion 221-1A of the CESL 221 is greater than the thickness D4 of the second portion 221-2A of the CESL 221 after performing the surface treatment process 362. The difference between the thickness D3 of the first portion 221-1A and the thickness D4 of the second portion 221-2A of the CESL 221 is greater than or equal to 2 nm. For example, the thickness D3 of the first portion 221-1A of the CESL 221 is about 5 nm, and the thickness D4 of the second portion 221-2A of the CESL 221 is about 3 nm.

Figure 3C:
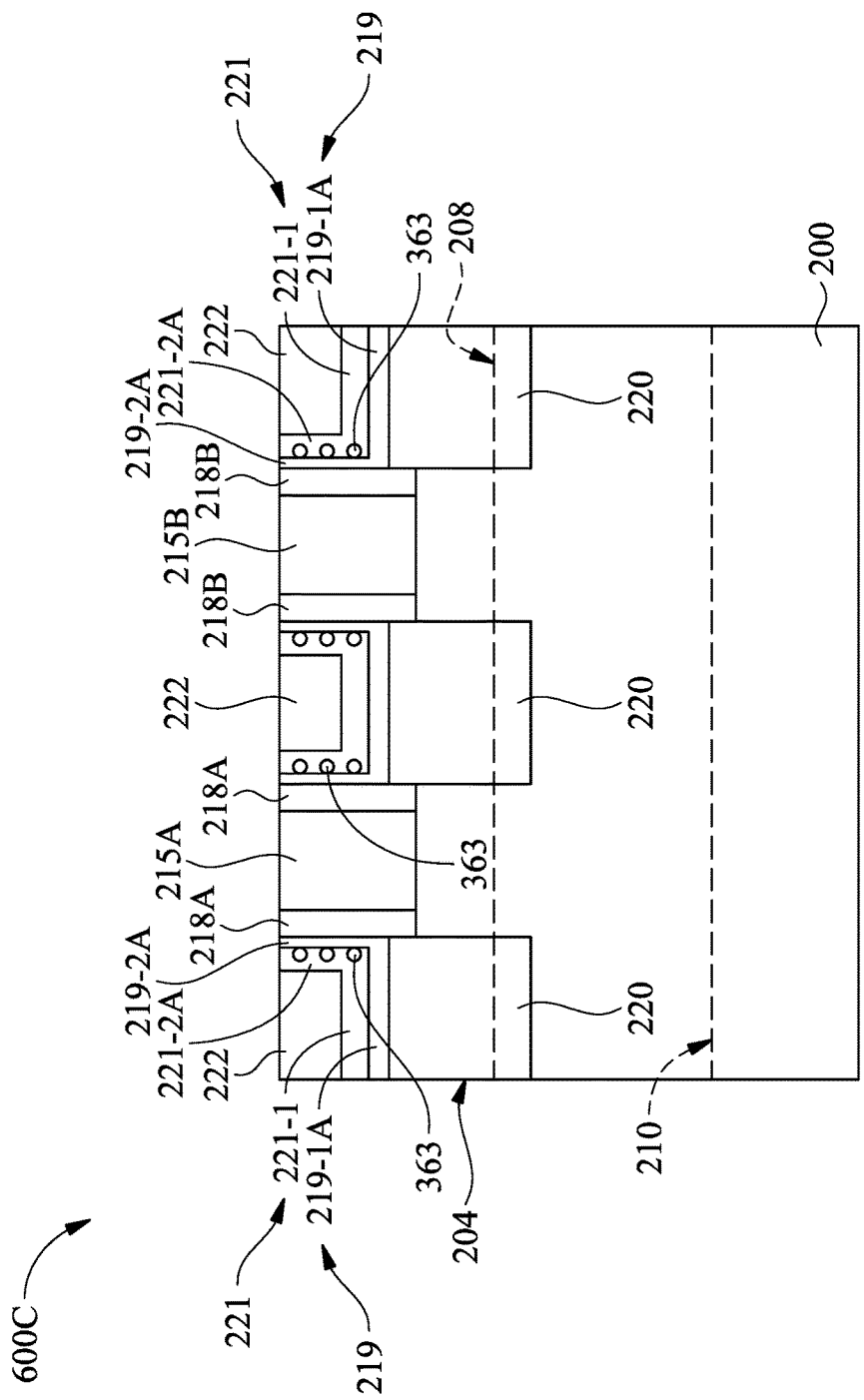

After the CESL 221 is formed, an inter-layer dielectric (ILD) layer 222 is formed over the CESL 221, as shown in FIG. 3C in accordance with some embodiments. The materials, configurations, structures and/or processes of the ILD layer 222 shown in FIG. 3C may be similar to, or the same as, those of the ILD layer 222 shown in FIG. 1H, and the details thereof are not repeated herein.

Figure 3D:
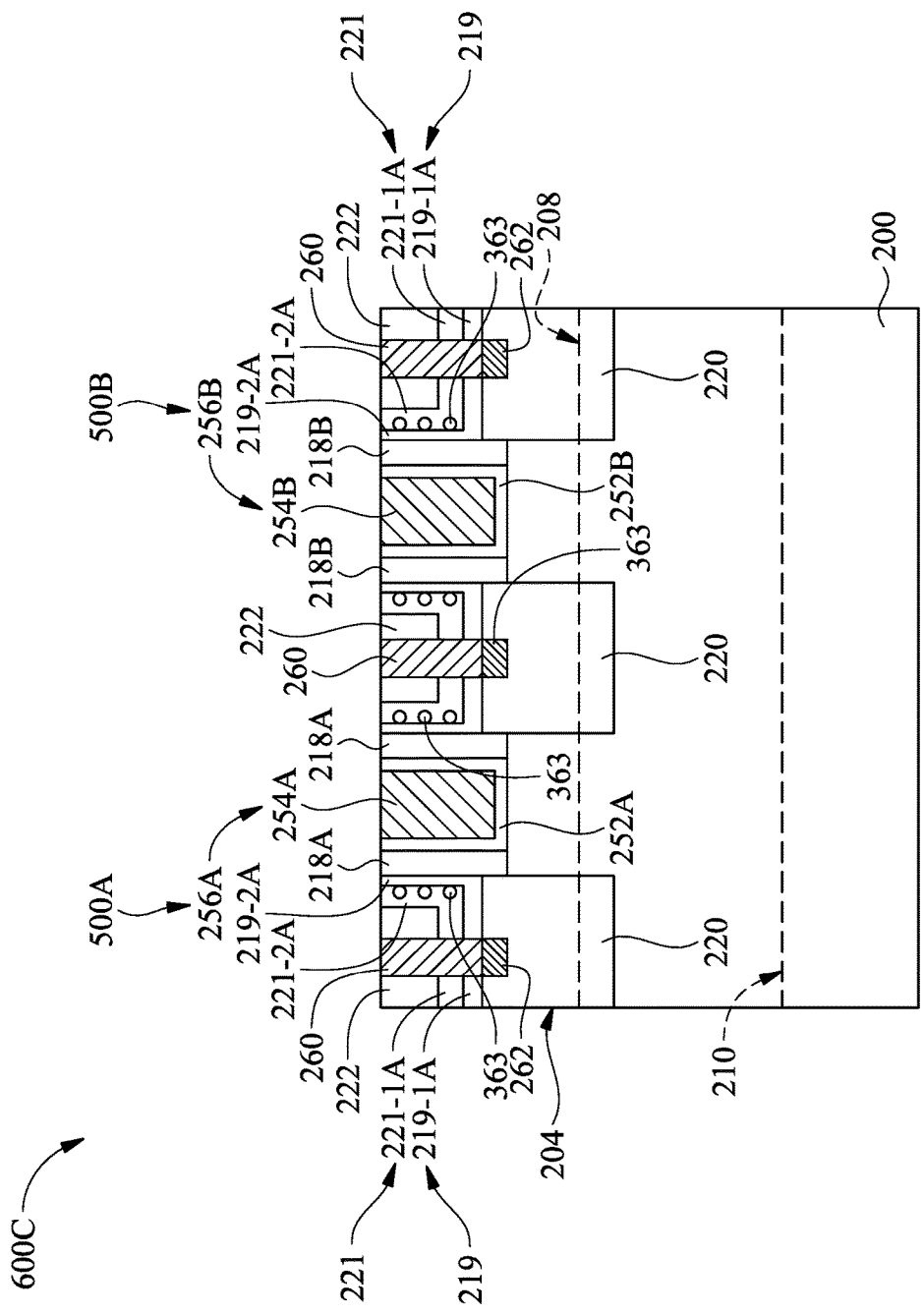

After the ILD layer 222 is formed, the metal gate structures 256A and 256B are formed to replace the dummy gate structure 215A and 215B. Afterwards, the source/drain silicide layers 262 and the contact plugs 260 are formed, as shown in FIG. 3D in accordance with some embodiments. The materials, configurations, structures and/or processes of the metal gate structures 256A and 256B the source/drain silicide layers 262 and the contact plugs 260, shown in FIG. 3D may be similar to, or the same as, those of the metal gate structures 256A and 256B the source/drain silicide layers 262 and the contact plugs 260 shown in FIG. 1I, and the details thereof are not repeated herein.

After performing the aforementioned processes the semiconductor structure 600C including the FinFET 500A and the FinFET 500B is formed, as shown in FIG. 3D in accordance with some embodiments.

In some embodiments, the method for forming the semiconductor structure 600C uses an isotropic etching process as the surface treatment process 362 to uniformly remove the native oxide 219 before forming the CESL 221. After the isotropic etching process is performed, the impurities 363 (e.g. C and/or F atoms) left on the gate spacers 218A and 218B may be chemically bonded to nitride atoms of the gate spacers 218A and 218B. Therefore, the second portion 221-2A of the CESL 221 on the outer sidewalls 318A and 318B of the gate spacers 218A and 218B is deposited at a lower deposition rate than that of the first portion 221-1A of the CESL 221 on the source/drain features 220.

The thickness of the CESL 221 on the gate spacers 218A and 218B (i.e. the thickness D4 of the second portion 221-2A) can be reduced while the thickness of the CESL 221 on the source/drain features 220 (i.e. the thickness D3 of the first portion 221-1) can be kept. The reduced thickness of the CESL 221 on the outer sidewalls 319 of the gate spacers 218A and 218B may help to reduce the parasitic capacitance between the contact plugs 260 and the metal gate structures 256A and 256B of the adjacent FinFETs 500A and 500B. The thickness of the CESL 221 on the source/drain features 220 may be maintained in an enough value to protect the source/drain features 220 during the contact hole etching process.

FIG. 4 is a cross-sectional view a semiconductor structure 600D, in accordance with some embodiments. The materials, configurations, structures and/or processes of the semiconductor structure 600D may be similar to, or the same as, those of the semiconductor structure 600C, and the details thereof are not repeated herein. One of the differences between the semiconductor device structure 600C and the semiconductor device structure 600D is that the semiconductor device structure 600D includes forming gate spacers 318A and 318B over the fin structure 204 and the gate spacers 218A and 218B before forming source/drain features 220. The semiconductor structure 600D may have advantages similar to the advantages of the semiconductor structure 600C, and the details thereof are not repeated herein.

Embodiments of a semiconductor structure (e.g. the semiconductor structures 600A, 600B, 600C and 600D) and a method for forming the same are provided. The method for forming the semiconductor structure includes forming a gate structure (e.g. the dummy gate structures 215A and 215B and the metal gate structures 256A and 256B) over a fin structure 204. The method further includes forming first gate spacers (e.g. the gate spacers 218A and 218B) over the fin structure and on opposite sidewalls (e.g. the sidewalls 315A and 315B) of the gate structure. The method further includes forming source/drain features 220 in the fin structure and adjacent to outer sidewalls (e.g. the outer sidewalls 318A and 318B) of the first gate spacers. The method further includes performing a surface treatment process (e.g. the surface treatment processes 360 and 362) on top surfaces 320 of the source/drain features 220 and the outer sidewalls of the first gate spacers. The method further includes depositing a contact etch stop layer (CESL) 221 over the source/drain features and the first gate spacers. A first portion (e.g. the first portions 221-1 and 221-1A) of the CESL is deposited over the top surfaces of the source/drain features at a first deposition rate. A second portion (e.g. the second portions 221-2 and 221-2A) of the CESL is deposited over the outer sidewalls of the first gate spacers at a second deposition rate. The thickness of the CESL on the gate spacers can be reduced while the thickness of the CESL on the source/drain features can be kept. The reduced thickness of the CESL on the outer sidewalls of the gate spacers may help to reduce the parasitic capacitance between the contact plugs and the metal gate structures of the adjacent FinFETs. The thickness of the CESL on the source/drain features may be maintained in an enough value to protect the source/drain features during the contact hole etching process.

Embodiments of a semiconductor structure and a method for forming the same are provided. The method includes forming a gate structure over a fin structure. The method further includes forming first gate spacers on opposite sidewalls of the gate structure. The method further includes forming source/drain features in the fin structure and adjacent to the first gate spacers. The method further includes performing a surface treatment process on top surfaces of the source/drain features and outer sidewalls of the first gate spacers. The method further includes depositing a contact etch stop layer (CESL) over the source/drain features and the first gate spacers. A first portion of the CESL is deposited over the top surfaces of the source/drain features at a first deposition rate. A second portion of the CESL is deposited over the outer sidewalls of the first gate spacers at a second deposition rate. The thickness of the CESL on the gate spacers can be reduced while the thickness of the CESL on the source/drain features can be kept. The parasitic capacitance between the contact plugs and the metal gate structures of the adjacent FinFETs can be reduced. The thickness of the CESL on the source/drain features may have an enough value to protect the source/drain features during the contact hole etching process.

In some embodiments, a method for forming a semiconductor structure is provided. The method includes forming a gate structure over a fin structure. The method further includes forming first gate spacers over the fin structure and on opposite sidewalls of the gate structure. The method further includes forming source/drain features in the fin structure and adjacent to outer sidewalls of the first gate spacers. The method further includes performing a surface treatment process on top surfaces of the source/drain features and the outer sidewalls of the first gate spacers. The method further includes depositing a contact etch stop layer (CESL) over the source/drain features and the first gate spacers. A first portion of the CESL is deposited over the top surfaces of the source/drain features at a first deposition rate. A second portion of the CESL is deposited over the outer sidewalls of the first gate spacers at a second deposition rate.

In some embodiments, a method for forming a semiconductor structure is provided. The method includes forming a gate structure over a fin structure. The method further includes forming first gate spacers over the fin structure and on opposite sidewalls of the first gate structure. The method further includes forming source/drain features in the fin structure and adjacent to outer sidewalls of the first gate spacers. The method further includes performing a surface treatment process on top surfaces of the source/drain features and the outer sidewalls of the first gate spacers. The method further includes forming a contact etch stop layer (CESL) over the source/drain features and the first gate spacers. The CESL includes a first portion covering the top surfaces of the source/drain features and a second portion covering the outer sidewalls of the first gate spacers. A first thickness of the first portion of the CESL is different from a second thickness of the second portion of the CESL.

In some embodiments, a semiconductor structure is provided. The semiconductor structure includes a gate structure over a fin structure, a first gate spacer, a source/drain feature and a contact etch stop layer (CESL). The first gate spacer is positioned over the fin structure and on a sidewall of the gate structure. The source/drain feature is positioned in the fin structure and adjacent to an outer sidewall of the first gate spacer. The CESL is positioned over the source/drain feature and the first gate spacer. The CESL has a first portion covering a top surface of the source/drain feature and a second portion covering the outer sidewall of the first gate spacer. A first thickness of the first portion of the CESL is different from a second thickness of the second portion of the CESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a gate structure over a fin structure;
    forming first gate spacers over the fin structure and on opposite sidewalls of the gate structure;
    forming source/drain features in the fin structure and adjacent to outer sidewalls of the first gate spacers;
    performing a surface treatment process on top surfaces of the source/drain features and the outer sidewalls of the first gate spacers; and
    depositing a contact etch stop layer (CESL) over the source/drain features and the first gate spacers,
    wherein a first portion of the CESL is deposited over the top surfaces of the source/drain features at a first deposition rate, a second portion of the CESL is deposited over the outer sidewalls of the first gate spacers at a second deposition rate, and the first deposition rate is higher than the second deposition rate.

2. The method for forming a semiconductor structure as claimed in claim 1, wherein a first thickness of the first portion is different from a second thickness of the second portion after performing the surface treatment process.

3. The method for forming a semiconductor structure as claimed in claim 1, wherein the surface treatment process is performed to remove a native oxide comprising:
    a first native oxide portion formed directly on the top surfaces of the source/drain features; and
    a second native oxide portion formed directly on the outer sidewalls of the first gate spacers.

4. The method for forming a semiconductor structure as claimed in claim 3, wherein the surface treatment process is a plasma pre-cleaning process.

5. The method for forming a semiconductor structure as claimed in claim 4, wherein the thickness of the first native oxide portion is less than the thickness of the second native oxide portion after performing the surface treatment process.

6. The method for forming a semiconductor structure as claimed in claim 4, wherein the plasma pre-cleaning process is performed using a process gas comprising argon (Ar), nitrogen ($N_2$), $H_2$/He, $H_2$, $NH_3$ or a combination thereof, wherein the plasma pre-cleaning process is performed using the process gas in a flow rate in a range from about 10 sccm to about 1000 sccm in an radio-frequency/direct-current (RF/DC) plasma, wherein the plasma pre-cleaning process is performed using a precursor comprising $C_4F_8$ or $CF_4$, wherein the plasma pre-cleaning process is performed with a bombardment energy in a range from about 10 eV to about 1000 eV, wherein the plasma pre-cleaning process is performed at a pressure in a range from about 100 Pa to about 1000 Pa and for a period of time in a range from about 30 seconds to about 300 seconds.

7. The method for forming a semiconductor structure as claimed in claim 3, wherein the surface treatment process is an isotropic etching process.

8. The method for forming a semiconductor structure as claimed in claim 7, wherein the isotropic etching process is performed using diluted hydrofluoric (DHF) acid.

9. The method for forming a semiconductor structure as claimed in claim 8, wherein impurities comprising carbon and/or fluorine are left on the outer sidewalls of the first gate spacers after performing the surface treatment process.

10. The method for forming a semiconductor structure as claimed in claim 1, further comprising:
    forming an inter-layer dielectric (ILD) structure over the fin structure, the gate structure, the first gate spacers and the source/drain features;
    forming a metal gate structure to replace the gate structure; and
    forming contact plugs over the source/drain features.

11. The method for forming a semiconductor structure as claimed in claim 1, further comprising:

forming second gate spacers over the fin structure and the first gate spacers before forming the source/drain features.

12. A method for forming a semiconductor structure, comprising:
    forming a gate structure over a fin structure;
    forming first gate spacers over the fin structure and on opposite sidewalls of the first gate structure;
    forming source/drain features in the fin structure and adjacent to outer sidewalls of the first gate spacers;
    performing a surface treatment process on top surfaces of the source/drain features and the outer sidewalls of the first gate spacers; and
    forming a contact etch stop layer (CESL) over the source/drain features and the first gate spacers, wherein the CESL comprises:
    a first portion covering the top surfaces of the source/drain features; and
    a second portion covering the outer sidewalls of the first gate spacers,
    wherein a first thickness of the first portion of the CESL is different from a second thickness of the second portion of the CESL, and wherein the first portion of the CESL is deposited at a first deposition rate, the second portion of the CESL is deposited at a second deposition rate that is different from the first deposition rate.

13. The method for forming a semiconductor structure as claimed in claim 12, wherein the surface treatment process is performed to remove a native oxide comprising:
    a first native oxide portion formed directly on the top surfaces of the source/drain features; and
    a second native oxide portion formed directly on the outer sidewalls of the first gate spacers.

14. The method for forming a semiconductor structure as claimed in claim 13, wherein the surface treatment process is a plasma pre-cleaning process, the surface treatment process is performed until the top surfaces of the source/drain features are exposed, and the second native oxide portion on the outer sidewalls of the first gate spacers is left after performing the surface treatment process.

15. The method for forming a semiconductor structure as claimed in claim 13, wherein the surface treatment process is an isotropic etching process, the isotropic etching process is performed using diluted hydrofluoric (DHF) acid, wherein impurities comprising carbon and/or fluorine are left on the outer sidewalls of the first gate spacers after performing the surface treatment process.

16. The method for forming a semiconductor structure as claimed in claim 12, further comprising:
    forming second gate spacers over the fin structure and the first gate spacers before forming the source/drain features;
    forming an inter-layer dielectric (ILD) structure over the fin structure, the gate structure, the first gate spacers and the source/drain features;
    removing the gate structure to form a trench;
    forming a metal gate structure in the trench; and
    forming contact plugs over the source/drain features.

17. A method for forming a semiconductor structure, comprising:
    forming a gate structure on a fin structure;
    forming a gate spacer on a sidewall of the gate structure;
    forming a source/drain feature in the fin structure;
    performing a surface treatment process on a top surface of the source/drain feature to form and leave positive charged ions on the top surface of the source/drain feature; and
    depositing a contact etch stop layer (CESL) on the top surface of the source/drain feature and an outer sidewall of the gate spacer.

18. The method for forming a semiconductor structure as claimed in claim 17, wherein the CESL comprises a first portion covering the top surface of the source/drain feature and a second portion covering the outer sidewall of the gate spacer, and a first thickness of the first portion is greater than a second thickness of the second portion.

19. The method for forming a semiconductor structure as claimed in claim 17, wherein a deposition rate of the CESL on the top surface of the source/drain feature is different from a deposition rate of the CESL on the outer sidewall of the gate spacer.

20. The method for forming a semiconductor structure as claimed in claim 19, wherein the deposition rate of the CESL on the top surface of the source/drain feature is greater than the deposition rate of the CESL on the outer sidewall of the gate spacer.

* * * * *